(12) United States Patent
Shao et al.

(10) Patent No.: US 12,446,213 B2
(45) Date of Patent: Oct. 14, 2025

(54) METHOD FOR FORMING SEMICONDUCTOR DEVICE AND SEMICONDUCTOR DEVICE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Deyuan Xiao, Hefei (CN); Weiping Bai, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 511 days.

(21) Appl. No.: 17/952,383

(22) Filed: Sep. 26, 2022

(65) Prior Publication Data
US 2023/0015279 A1    Jan. 19, 2023

(30) Foreign Application Priority Data
Nov. 19, 2021    (CN) .......................... 202111376056.3

(51) Int. Cl.
*H10B 12/00* (2023.01)
*G11C 5/06* (2006.01)

(52) U.S. Cl.
CPC .......... *H10B 12/488* (2023.02); *G11C 5/063* (2013.01); *H10B 12/033* (2023.02); *H10B 12/315* (2023.02); *H10B 12/482* (2023.02)

(58) Field of Classification Search
CPC .. H10B 12/488; H10B 12/482; H10B 12/033; H10B 12/315
See application file for complete search history.

(56) References Cited

U.S. PATENT DOCUMENTS 11,417,659 B2    8/2022  Son
2019/0074363 A1*  3/2019  Zhu ....................... H10D 30/63

FOREIGN PATENT DOCUMENTS

CN    112635471 A    4/2021

* cited by examiner

*Primary Examiner* — Steven M Page
(74) *Attorney, Agent, or Firm* — Syncoda LLC; Feng Ma

(57) ABSTRACT

A method for forming a semiconductor device includes the following operations. A stacked structure is provided, which includes a substrate, and sacrificial layers and semiconductor layers alternately stacked on surface of the substrate. Multiple first grooves and semiconductor pillars extending in first direction are included in the sacrificial layers and the semiconductor layers. Word line pillars are formed in second direction, intersect with the semiconductor pillars and surround the semiconductor pillars. Sources and drains are formed respectively on either side of the semiconductor pillars surrounded by the word line pillars by an epitaxial growth process. Bit lines are formed on a side of the sources or the drains, are connected with same, and extend in third direction. The first, second and third directions are pairwise perpendicular. Capacitors are formed on a side of the sources or the drains where the bit lines are not formed to form a semiconductor device.

11 Claims, 25 Drawing Sheets

US 12,446,213 B2

METHOD FOR FORMING SEMICONDUCTOR DEVICE AND SEMICONDUCTOR DEVICE

CROSS-REFERENCE TO RELATED APPLICATION

The present application claims priority of Chinese Application No. 202111376056.3, filed on Nov. 19, 2021, the contents of which are hereby incorporated by reference in its entirety.

BACKGROUND

With the continuous reduction of manufacturing process dimension of semiconductor devices, gate oxides (GOX) and word lines (WL) are deposited by atomic layer deposition (ALD) to form vertical word lines and Gate-All-Around (GAA) structures, which reduces process challenges and yield problems caused by the miniaturization of semiconductor devices.

However, during the development of semiconductor devices towards 3D, the number of stacked layers of semiconductor devices is limited due to limitations of the manufacturing process of semiconductor devices in related art.

SUMMARY

The disclosure relates to the technical field of semiconductors, and relates to, but is not limited to, a method for forming a semiconductor device, and a semiconductor device.

In a first aspect, embodiments of the disclosure provide a method for forming a semiconductor device. The method includes the following operations.

A stacked structure is provided, which includes a substrate, and sacrificial layers and semiconductor layers alternately stacked on a surface of the substrate. Multiple first grooves and semiconductor pillars extending in a first direction are included in the sacrificial layers and the semiconductor layers. The first grooves and the semiconductor pillars are arranged at intervals.

Word line pillars are formed in a second direction. The word line pillars intersect with the semiconductor pillars and surround the semiconductor pillars. The first direction is perpendicular to the second direction.

Sources and drains are formed respectively on either side of the semiconductor pillars surrounded by the word line pillars by an epitaxial growth process.

Bit lines are formed on a side of the sources or the drains. The bit lines are connected with the sources or the drains. The bit lines extend in a third direction. The first direction, the second direction and the third direction are pairwise perpendicular.

Capacitors are formed on a side of the sources or the drains where the bit lines are not formed to form a semiconductor device.

In a second aspect, embodiments of the disclosure provide a semiconductor device, at least including a substrate and a semiconductor structure located on a surface of the substrate.

The semiconductor structure at least includes semiconductor pillars stacked at intervals on the surface of the substrate, word line pillars, active areas, bit lines and capacitors. The semiconductor pillars extend in a first direction, and are arranged at intervals in a second direction.

The word line pillars extend in the second direction, intersect with the semiconductor pillars and surround the semiconductor pillars. The first direction is perpendicular to the second direction.

The active areas include sources and drains. The sources and the drains are located in the semiconductor pillars and are distributed on either side of the semiconductor pillars surrounded by the word line pillars.

The bit lines are located on a side of the sources or the drains, and are connected with the sources or the drains. The bit lines extend in a third direction. The first direction, the second direction and the third direction are pairwise perpendicular.

The capacitors are located on a side of the sources or the drains where the bit lines are not formed.

BRIEF DESCRIPTION OF THE DRAWINGS

In the accompany drawings (which are not necessarily drawn to scale), similar reference numerals may describe like components in different views. Similar reference symbols with different letter suffixes may denote different examples of similar components. The accompanying drawings generally illustrate the various embodiments discussed herein by way of example and not limitation.

DESCRIPTION OF REFERENCE NUMERALS

Figure 1:
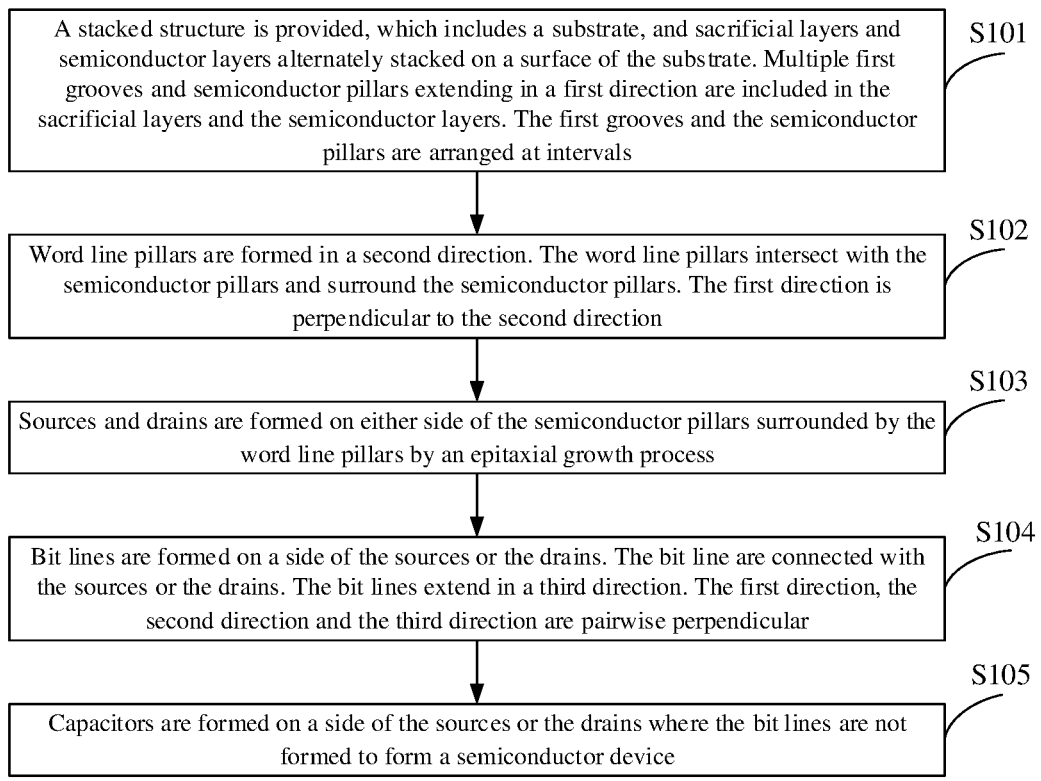
FIG. 1 is a schematic flowchart of a method for forming a semiconductor device provided by an embodiment of the disclosure.

20—stacked structure; 201—substrate; 202—sacrificial layer; 203—semiconductor layer; 204—first groove; 205—semiconductor pillar; 206—word line pillar; 207—second groove; 208'—initial gate oxide layer; 209'—initial dielectric layer; 208—gate oxide layer; 209—dielectric layer; 210—source; 211—drain; 212—bit line; 213—word line isolation layer; 214—third groove; 215—first electrode layer; 216—filling material; 217—capacitive dielectric layer; 218—second electrode layer; 301—space; 302—source; 303—drain; 401—isolation layer; 402—bit line trench; 403—bit line; 501—isolation layer; 502—bit line isolation layer; 503—bit line; 61—substrate; 62—semiconductor structure; 621—semiconductor pillar; 622—word line pillar; 623—active area; 6231—source; 6232—drain; 624—bit line; 625—capacitor; 626—word line isolation layer; 627—bit line isolation layer; 6251—first electrode layer; 6252—capacitive dielectric layer; 6253—second electrode layer; 6254—capacitor filler.

DETAILED DESCRIPTION

A specific technical solution of the disclosure will be further described in detail below with reference to accompany drawings in embodiments of the disclosure. The following embodiments are used to illustrate the present disclosure, but are not used to limit the scope of the present disclosure.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure, that is, not all features of the actual embodiments are described herein, and well-known functions and structures are not described in detail.

In the figures, the dimensions of layers, regions, elements and their relative dimensions may be exaggerated for clarity. The same reference numerals denote the same elements throughout.

It should be understood that when an element or layer is referred to as being "on", "adjacent to", "connected to" or "coupled to" another element or layer, it may be directly on, adjacent to, connected to, or coupled to the other element or layer, or there maybe intervening elements or layers. Conversely, when an element is referred to as being "directly on", "directly adjacent to", "directly connected to" or "directly coupled to" another element or layer, there is no intervening element or layer. It should be understood that, although the terms first, second, third, etc. may be used to describe various elements, components, regions, layers, and/or portions, the elements, components, regions, layers, and/or portions should not be limited by these terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

Spatial relationship terms such as "below", "under", "lower", "beneath", "above", and "upper" etc. may be used herein for conveniently describing a relationship between one element or feature and another element or feature illustrated in the figures. It is to be understood that, in addition to the orientations shown in the figures, the spatial relationship terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both orientations, on and under. The device may be additionally oriented (rotated 90 degrees or otherwise), and the spatial descriptors used herein are interpreted accordingly.

The terminology used herein is intended to describe the specific embodiments only and is not to be a limitation of the disclosure. As used herein, singular forms "a", "an" and "said/the" are also intended to include plural forms, unless the context clearly indicates otherwise. It should also be understood that the terms "consist . . . of" and/or "including", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

In related art, during forming sources and drains in a semiconductor device, sources and drains are usually formed in active areas by Ion Implantation (IMP), which limits the number of stacked layers of a semiconductor device.

Based on problems existing in related art, the embodiments of the disclosure provide a method for forming a semiconductor device. Referring to FIG. 1, which is a schematic flowchart of the method for forming a semiconductor device provided by the embodiments of the disclosure, a capacitor provided by the embodiments of the disclosure can be formed by the following operations.

In S101, a stacked structure is provided, which includes a substrate, and sacrificial layers and semiconductor layers alternately stacked on a surface of the substrate. Multiple first grooves and semiconductor pillars extending in a first direction are included in the sacrificial layers and the semiconductor layers. The first grooves and the semiconductor pillars are arranged at intervals.

In S102, word line pillars are formed in a second direction. The word line pillars intersect with the semiconductor pillars and surround the semiconductor pillars. The first direction is perpendicular to the second direction.

In S103, sources and drains are formed respectively on either side of the semiconductor pillars surrounded by the word line pillars by an epitaxial growth process.

In S104, bit lines are formed on a side of the sources or the drains. The bit lines are connected with the sources or the drains. The bit lines extend in a third direction. The first direction, the second direction and the third direction are pairwise perpendicular.

In S105, capacitors are formed on a side of the sources or the drains where the bit lines are not formed to form a semiconductor device.

The method for forming a semiconductor device provided by the embodiments of the present disclosure will be described in detail below with reference to FIGS. 2A to 2N.

Figure 2A:
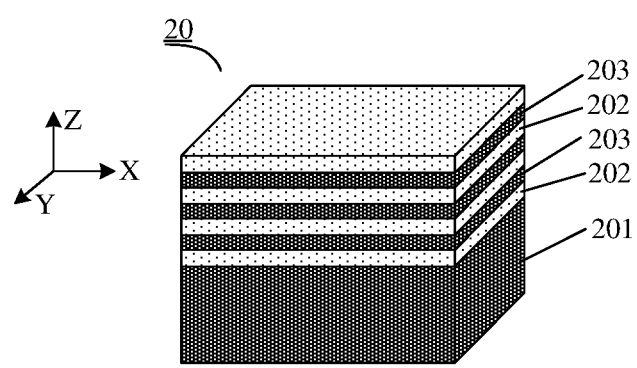
FIGS. 2A to 2N are schematic diagrams of local structures of a semiconductor device provided by an embodiment of the disclosure.
Figure 2B:
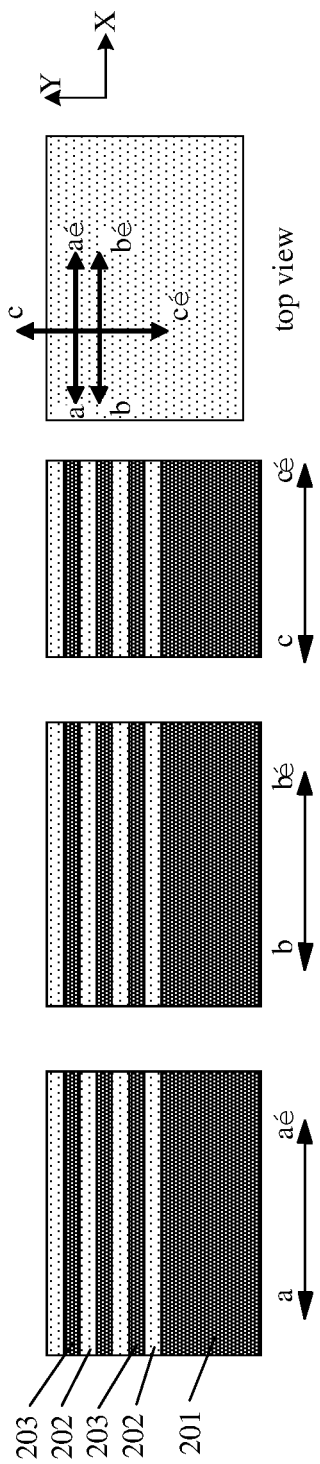
Figure 2C:
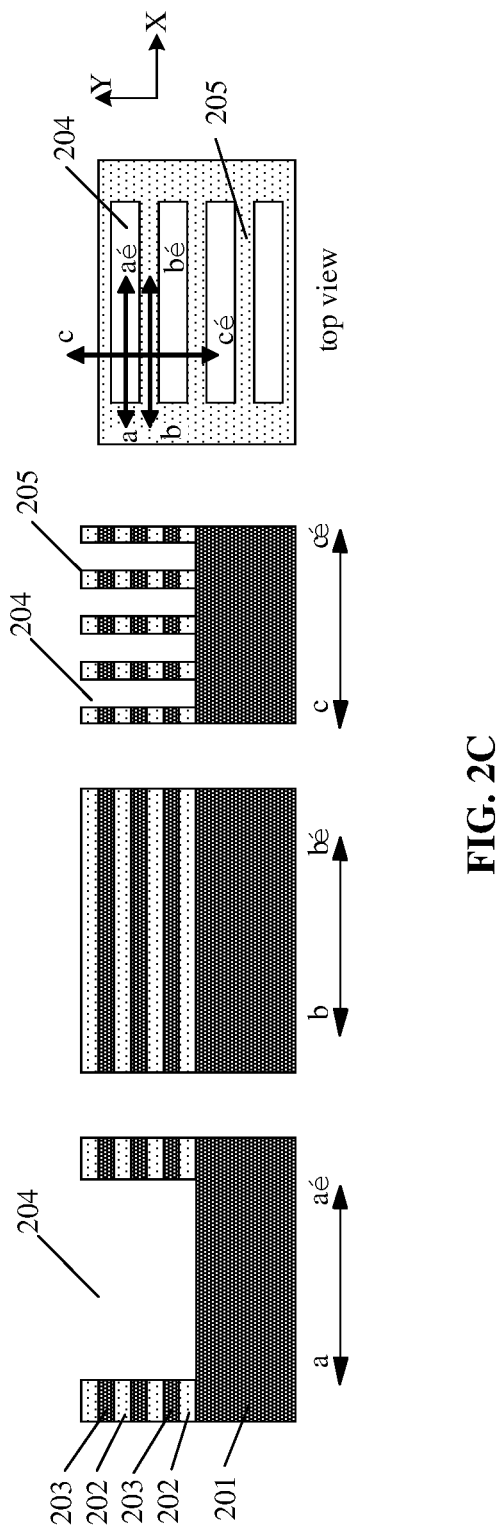

As shown in FIGS. 2A to 2C, S101 is performed to provide a stacked structure 20. The stacked structure 20 includes a substrate 201 and sacrificial layers 202 and semiconductor layers 203 alternately stacked on a surface of the substrate 201. Multiple first grooves 204 and semiconductor pillars 205 extending in a first direction are included in the sacrificial layers 202 and the semiconductor layers 203. The first grooves 204 and the semiconductor pillars 205 are arranged at intervals.

In some embodiments, the substrate 201 may be made of a semiconductor material, such as one or more of silicon, germanium, a silicon-germanium compound and a silicon-carbon compound. The sacrificial layers 202 and the semiconductor layers 203 may be formed on the surface of the substrate 201 by a superlattice epitaxial process. A semiconductor superlattice structure is a single crystal formed by periodically arranging a group of multilayer thin films.

In an embodiment of the disclosure, a material of the semiconductor layer 203 may be the same as that of the substrate 201. For example, when the substrate 201 is a silicon substrate, the material of the semiconductor layer 203 is silicon, a material of the sacrificial layer is silicon germanium, and the stacked structure 20 is composed of a silicon/silicon germanium/silicon/silicon germanium superlattice structure. As shown in FIG. 2A, the X direction is a first direction, the Y direction is a third direction, and the Z direction is a second direction. The first direction, the second direction, and the third direction are pairwise perpendicular.

In some embodiments, FIG. 2B shows a top view of the stacked structure 20 and cross-sectional views of the stacked structure 20 in the directions a-a', b-b' and c-c' in the top view.

In the embodiments of the disclosure, the multiple first grooves 204 and semiconductor pillars 205 extending in the first direction (i.e., the X direction) are formed in the stacked structure 20 by etching the stacked structure 20. The first grooves 204 expose the upper surface of the substrate 201, as shown in FIG. 2C.

Next, referring to FIGS. 2D to 2G, S102 is performed to form word line pillars 206 in the second direction. The word line pillars 206 intersect with the semiconductor pillars 205 and surround the semiconductor pillars 205.

In some embodiments, the formation of the word line pillars 206 may be achieved by the following operations.

In S1021, the sacrificial layers in the semiconductor pillars are removed to form second grooves.

Figure 2D:
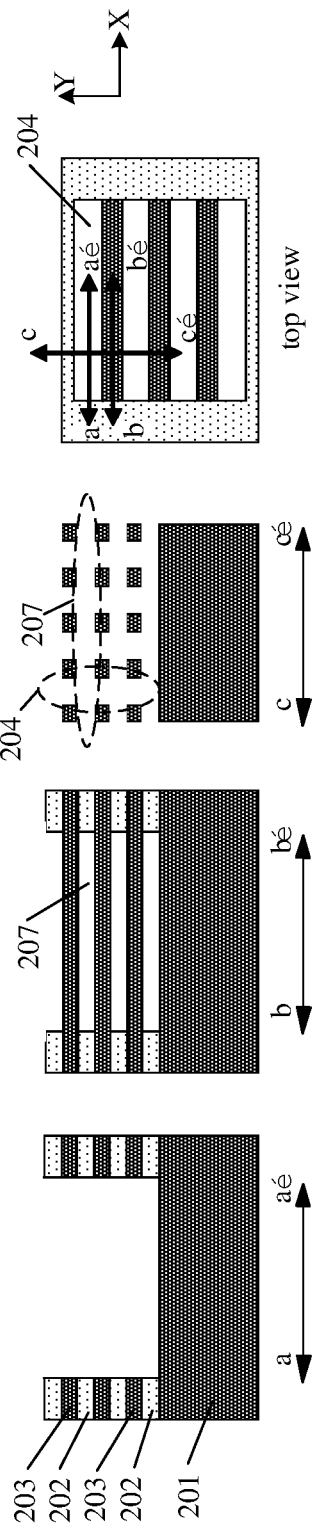

In some embodiments, as shown in FIG. 2D, a dry etching process or a wet etching process may be employed to remove the sacrificial layers 202 in the semiconductor pillars 205. After the sacrificial layers 202 are removed, the second grooves 207 are formed at locations of the original sacrificial layers 202.

In S1022, an initial gate oxide layer and an initial dielectric layer are formed sequentially on surfaces of the first grooves and the second grooves.

Figure 2E:
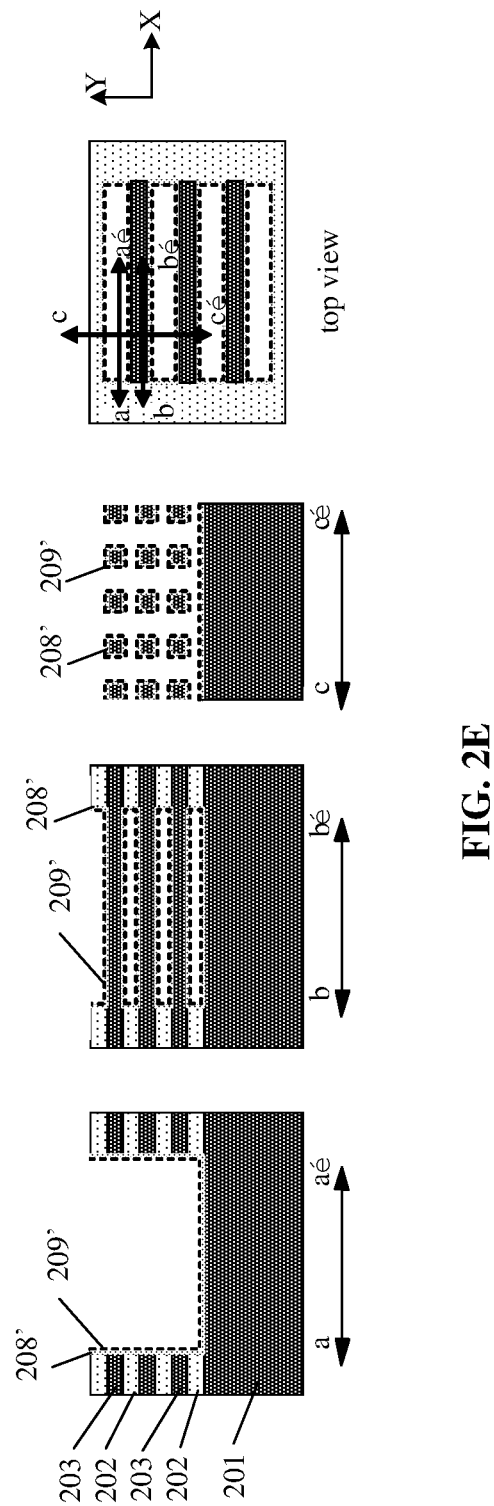

In an embodiment of the disclosure, an initial gate oxide layer 208' and an initial dielectric layer 209' may be formed on the surfaces of the first grooves 204 and the second grooves 207 sequentially by means of a Physical Vapor Deposition (PVD) process, a Chemical Vapor Deposition (CVD) process or an atomic layer deposition process, as shown in FIG. 2E.

In some embodiments, the initial gate oxide layer 208' may be formed from a material, such as silicon dioxide or silicon oxynitride. The initial dielectric layer 209' may be a high-K dielectric layer. The initial dielectric layer 209' may be a metal silicate or a metal oxide, for example, one or more of tantalum oxide ($Ta_2O_5$), titanium oxide ($TiO_2$), zirconia ($ZrO_2$), alumina ($Al_2O_3$) Hafnium silicon oxide ($HfSiO_2$) or hafnium oxide (HfO2) and other materials.

In S1023, the word line pillars are formed in the second direction at preset positions of the semiconductor pillars. The word line pillars intersect with and surround part of the initial dielectric layer.

Figure 2F:
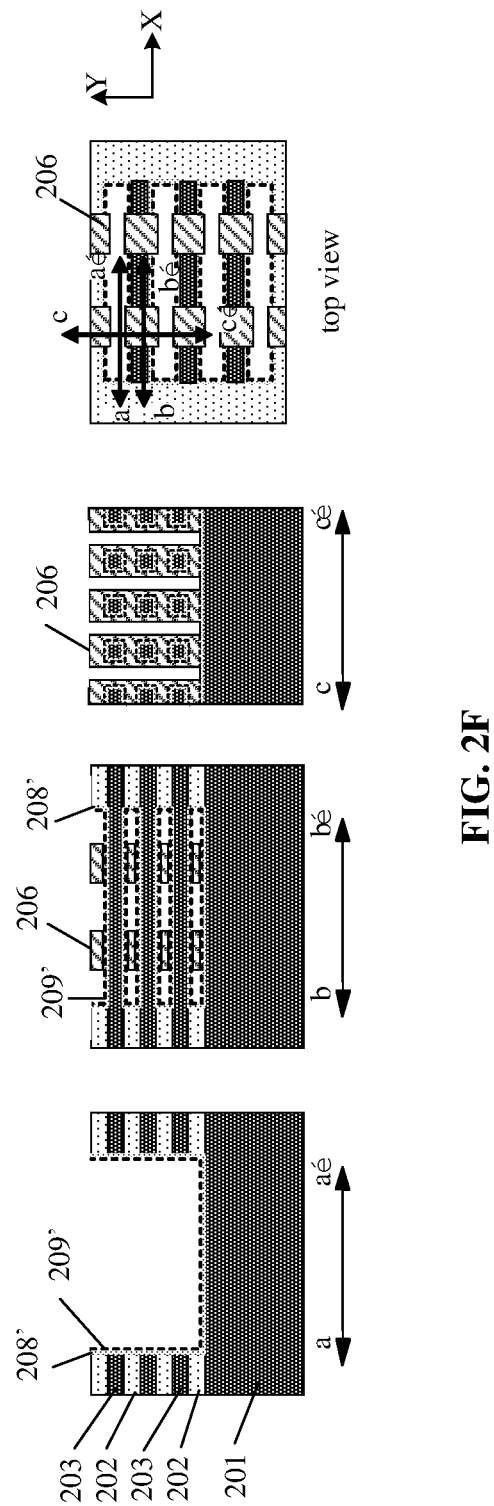

In some embodiments, the preset positions refer to the positions where the word line pillars 206 are to be formed. In the embodiment of the disclosure, two word line pillars 206 are formed on a semiconductor pillar 205, as shown in FIG. 2F. The word line pillars 206 intersect with and surround part of the initial dielectric layer 209'.

In the embodiments of the disclosure, the word line pillars 206 are perpendicular to the substrate 201.

In S1024, the initial gate oxide layer and the initial dielectric layer except in the word line pillars on the surfaces of the first grooves and the second grooves are removed to form gate oxide layers and dielectric layers in the word line pillars.

Figure 2G:
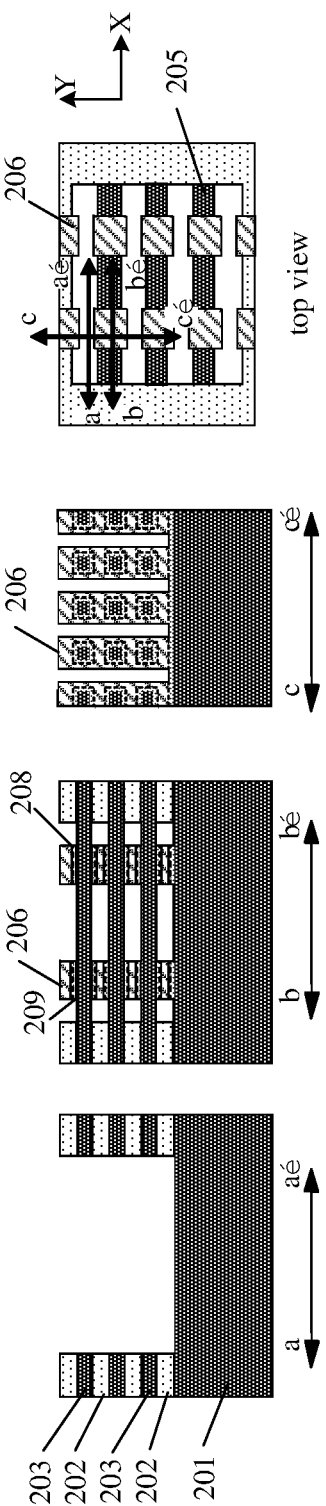

In some embodiments, as shown in FIG. 2G, after the word line pillars 206 are formed, the initial gate oxide layer 208' and the initial dielectric layer 209' except in the word line pillars 206 are to be removed to form the gate oxide layers 208 and the dielectric layers 209 in the word line pillars 206.

In the embodiments of the disclosure, the word line pillar 206 are composed of multiple Gate-All-Around (GAA) structures stacked in the second direction (i.e., the Z direction). Each of the GAA structures includes part of the semiconductor pillar 205, and a gate oxide layer 208, a dielectric layer 209 and a gate (that is, a word line 206) that sequentially surround the part of the semiconductor pillar 205 with the first direction (that is, the X direction) as an axis. A material of the word line pillar is a conductive material, which may be one of a doped semiconductor material, a conductive metal nitride material, a metal material or a metal-semiconductor compound.

Figure 2H:
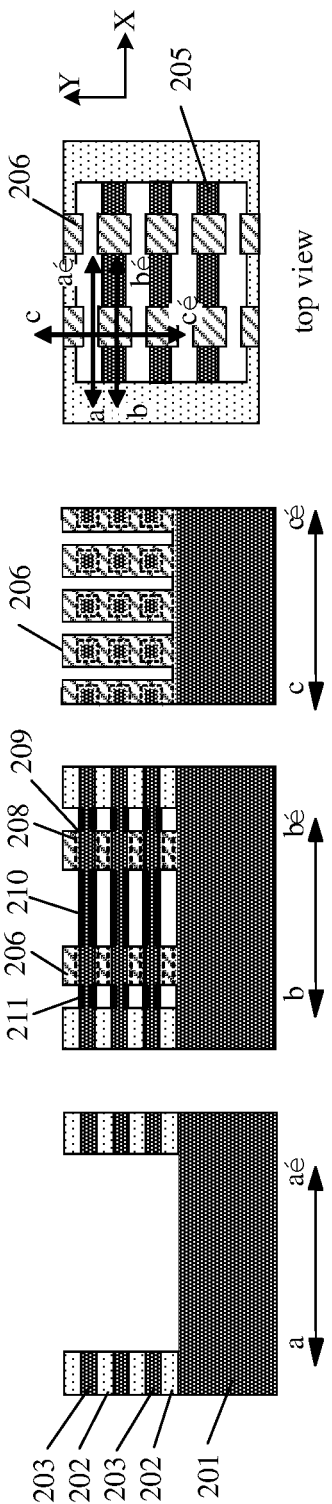

Next, referring to FIG. 2H, S103 is performed to form sources 210 and drains 211 respectively at either side of the semiconductor pillars 205 surrounded by the word line pillars 206 by an epitaxial growth process.

In some embodiments, as shown in FIG. 2H, common sources 210 may be formed between two word line pillars 206. The drains 211 are formed on the other sides of the word line pillars 206, respectively, followed by forming bit lines in the common sources 210. The bit lines are connected to the sources. The common drains 211 may also be formed between two word line pillars 206. The sources 210 are formed on the other sides of the word line pillars 206, respectively, followed by forming bit lines in the common drains 211. The bit lines are connected to the drains. The solution is not shown in the schematic diagrams of the embodiments of the present disclosure.

In the embodiments of the disclosure, a thickness of the source 210 and the drain 211 in the second direction (that is, the Z direction) is less than a sum of thicknesses of the semiconductor layer 203 and the gate oxide layer 208 in the second direction, thereby avoiding failure of the semiconductor device due to contact of the sources 210 and the drains 211 with the dielectric layer 209.

In the embodiments of the disclosure, the sources and the drains are formed by an epitaxial growth process improving the problem in the related art that the number of stacked layers of Dynamic Random Access Memory (DRAM) is limited because the sources and the drains are formed by ion implantation. Therefore, the number of stacked layers of the semiconductor device provided by the embodiments of the present disclosure is not limited, so that the DRAM Logic can realize 3D development like a computer flash memory device (NAND).

Figure 2I:
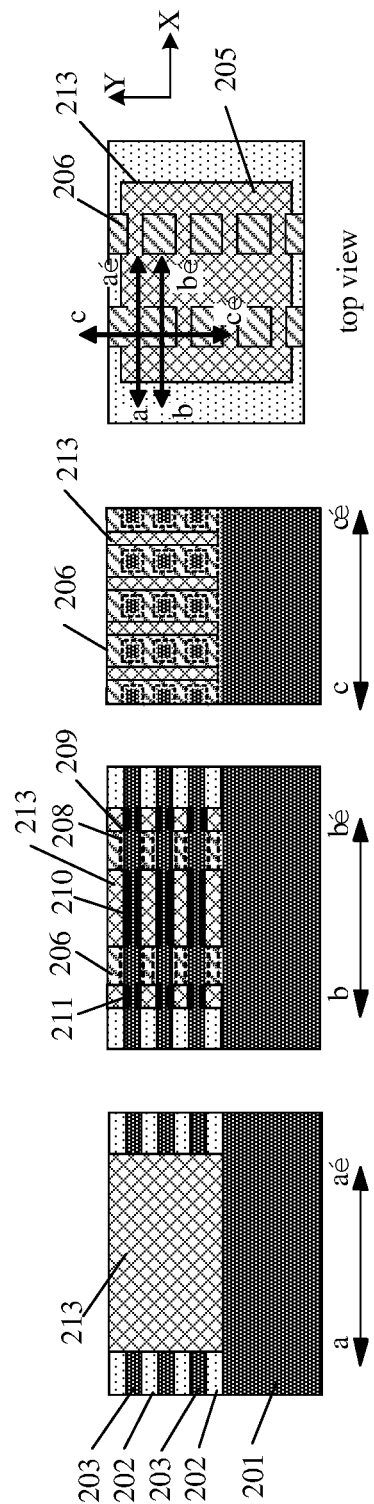
Figure 2J:
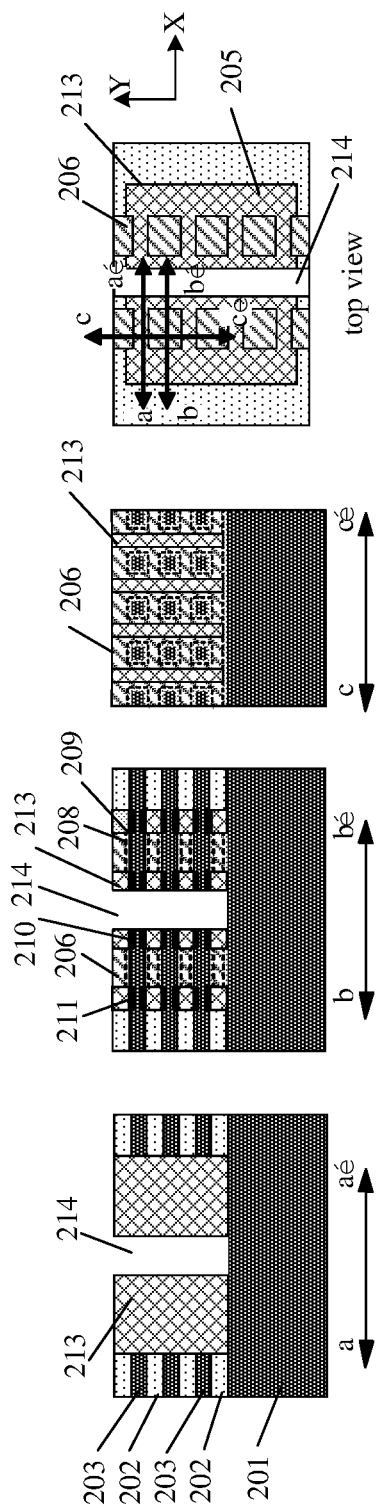
Figure 2K:
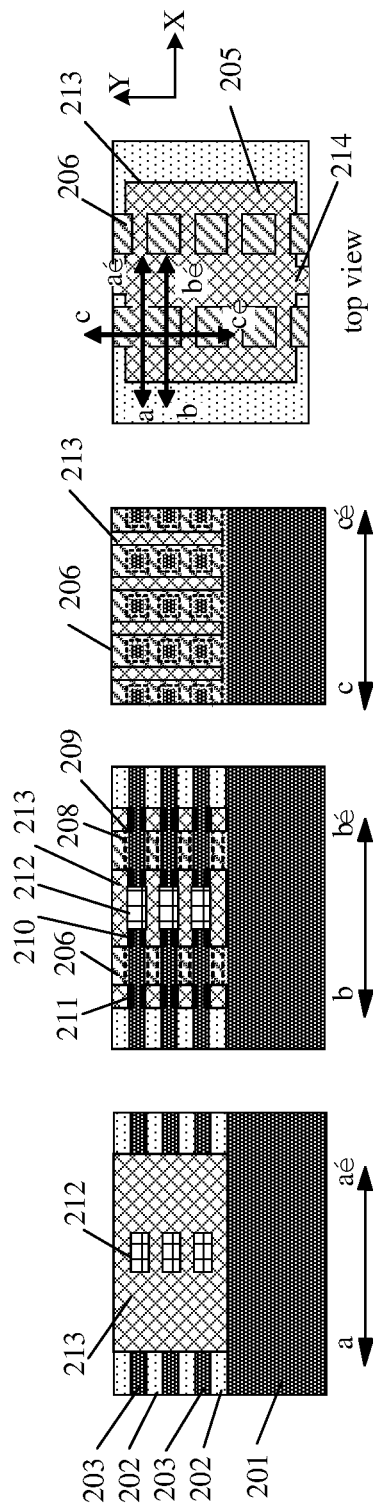

Next, referring to FIGS. 2I to 2K, S104 is performed to form the bit lines 212 on a side of the sources 210 or the drains 211. The bit lines 212 are connected to the sources 210 or the drains 211. The bit lines 212 are parallel to the substrate 201 and extend in the third direction (that is, the Y direction).

In some embodiments, prior to forming the bit lines 212, the embodiments of the present disclosure further include the following operation. Word line isolation layers 213 are formed in the remaining first grooves 204 and the remaining second grooves 207, as shown in FIG. 2I.

In an embodiments of the disclosure, the word line isolation layers 213 may be formed by physical vapor deposition, chemical vapor deposition, atomic layer deposition process or spin coating, and the word line isolation layers 213 may be formed from a material such as silicon dioxide.

After forming the word line isolation layers 213, S104 may include the following operations.

In S1041, a third groove extending in the third direction is formed. The third groove is located at a side of the sources or the drains, and exposes the substrate.

In some embodiments, the third groove 214 may be formed by a dry etching process or a wet etching process. As shown in FIG. 2J, in which it is shown that the third groove 214 is formed at a side of the common sources 210. However, when the semiconductor device shares the drains 211, the third groove may also be formed at a side of the drains. The case where the third groove are formed at a side of the drains is not shown in the schematic structural diagrams of the embodiments of the present disclosure.

In S1042, the bit lines are formed in the third groove.

As shown in FIG. 2K, the third groove 214 may first be filled by physical vapor deposition, chemical vapor deposition, atomic layer deposition process or spin coating, and a material for filling the third groove 214 may be the same as that of the word line isolation layers 213, for example, silicon dioxide. Bit line trenches are formed by wet etching in the filler, and then the bit lines 212 are formed by filling the bit line trenches by a vapor deposition or atomic layer deposition process. The bit lines 212 are parallel to the substrate 201 and extend in a third direction (that is, the Y direction).

In some embodiments, a material of the bit lines includes tungsten (W), cobalt (Co), copper (Cu), aluminum (Al), polysilicon, doped silicon, silicide, or any combination thereof.

Figure 2L:
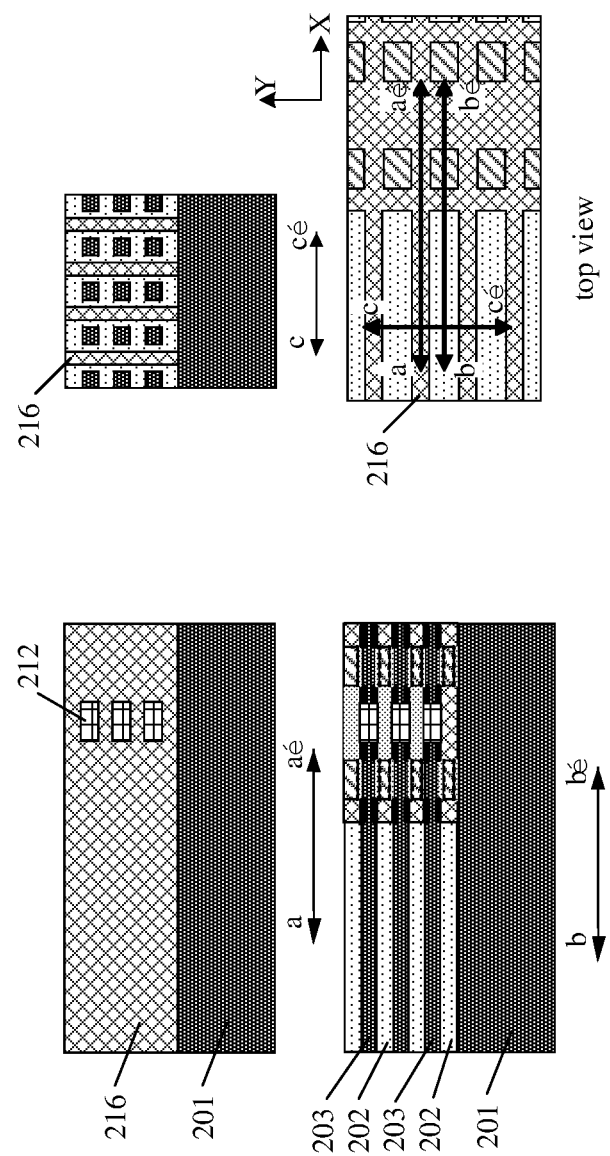
Figure 2M:
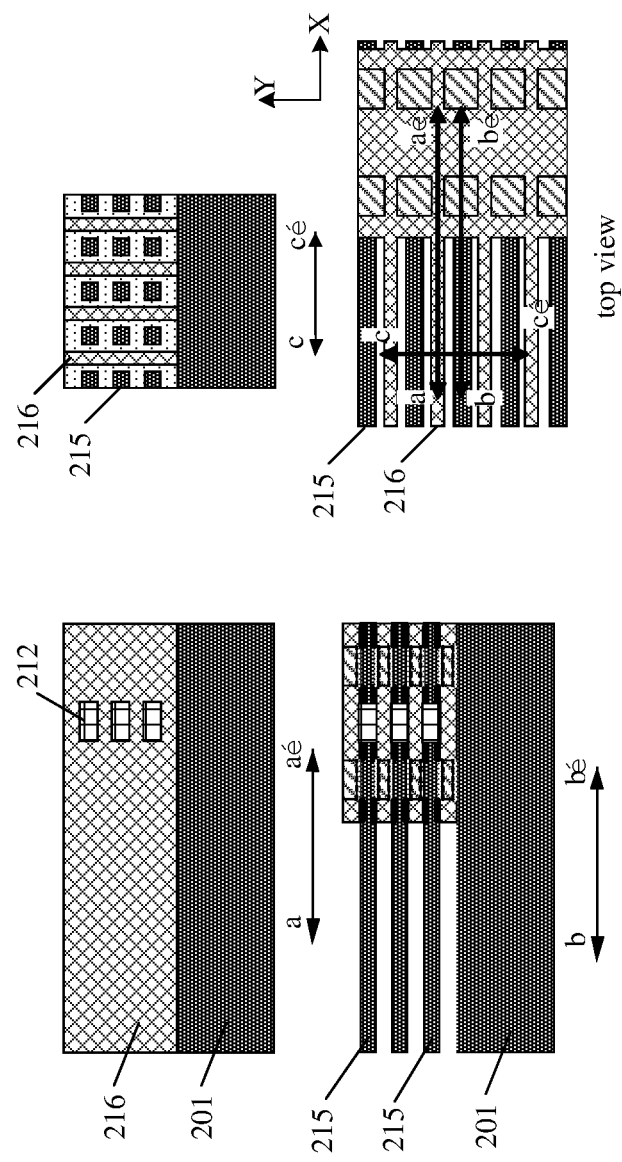
Figure 2N:
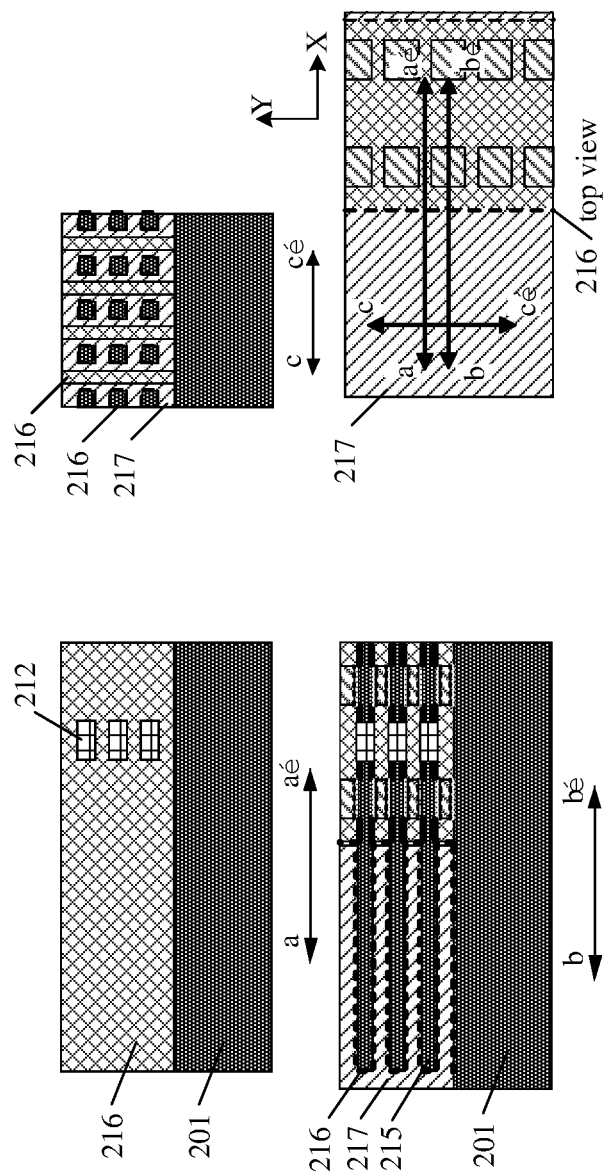

Next, referring to FIGS. 2L to 2N, S105 is performed to form the capacitors on a side of the sources 210 or the drains 211 where the bit lines 212 are not formed, so as to form the semiconductor device. When the bit lines 212 are formed on a side of the sources 210 in S104, the capacitors are formed on a side of the drains 211 in S105. When the bit lines 212 are formed on a side of the drains 211 in S104, the capacitors are formed on a side of the sources 210 in S105. The embodiments of the disclosure describes the method for forming a semiconductor device provided by the embodiments of the present disclosure by an example where the bit lines 212 are formed on a side of the sources 210 and the capacitors are formed on a side of the drains 211.

In some embodiments, the capacitors may be formed by the following operations.

In S1051, sacrificial layers and part of the semiconductor layer in the stacked structure on the side of the sources or the drains where the bit lines are not formed are removed to form first electrode layers extending in the first direction and connected to the sources or the drains.

In some embodiments, the capacitors may be formed on drains 211 on both sides of the word line pillars 206. The embodiments of this disclosure describes a method for forming the capacitors provided by the embodiments of the disclosure by an example where the capacitors are formed on the drains 211 at one side.

As shown in FIG. 2L, before forming the first electrode layers 215, part of the sacrificial layer 202 and part of the semiconductor layer 203 located on the side of the drains 211 are to be removed to form trenches extending in the first direction. The trenches are filled by physical vapor deposition, chemical vapor deposition, or atomic layer deposition to form a filling material 216, which may be the same material as the word line isolation layers, such as silicon dioxide.

Next, referring to FIG. 2M, the sacrificial layers 202 on the side of the drains 211 are removed by dry etching or wet etching. The remaining semiconductor layers 203 are connected to the drains, that is, are the first electrode layers 215, which are parallel to the substrate and extend in the first direction. A material of the first electrode layers 215 may be a metal nitride or a metal silicide, for example, titanium nitride.

In S1052, a capacitive dielectric layer and a second electrode layer covering the first electrode layer are formed sequentially.

Next, referring to FIG. 2N, the capacitive dielectric layer 217 and second electrode layer 218 are formed by physical vapor deposition, chemical vapor deposition or atomic layer deposition sequentially.

In some embodiments, a material of the capacitive dielectric layer 217 may include at least one of zirconia, hafnium oxide, titanium zirconium oxide, ruthenium oxide, antimony oxide and alumina. A material of the second electrode layer 218 may include at least one of a metal nitride and a metal silicide.

In S1053, a gap between the second electrode layers is filled to form the capacitors.

In some embodiments, a silicon-germanium material may be used to fill the gap between the second electrode layers 218, which is not shown in the drawings of the embodiments of the present disclosure.

In the embodiments of the disclosure, after the word lines are formed in the semiconductor pillars of the stacked structure, the sources and drains are respectively formed at either side of the semiconductor pillars surrounded by the word line pillars by an epitaxial growth process, the bit lines are formed on one side of the sources or the drains, and the capacitors are formed on the other side of the word line pillars relative to the bit lines, so as to form a semiconductor device. In the embodiments of the disclosure, the sources and drains are formed in the stacked structure of the semiconductor device through an epitaxial growth process, so that the number of the stacked layer of the semiconductor device is not limited, and thereby the performance of the semiconductor device is improved. Moreover, the disclosure adopts the manufacturing method in which word lines are vertical, bit lines are horizontal, the sources/drains are grown epitaxially, and the capacitors are horizontal, so that the 3D semiconductor device provided by the embodiments of the disclosure is not limited by the number of stacked layers. Thus, the dimension of the semiconductor device can be continuously reduced, and thereby the performance of the semiconductor device is further enhanced.

In some embodiments, before the formation of the sources 210 and the drains 211, the following operation may further be included.

In S10, the spaces are formed by removing part of a semiconductor layer except in the word line pillars in the semiconductor pillar.

Figure 3A:
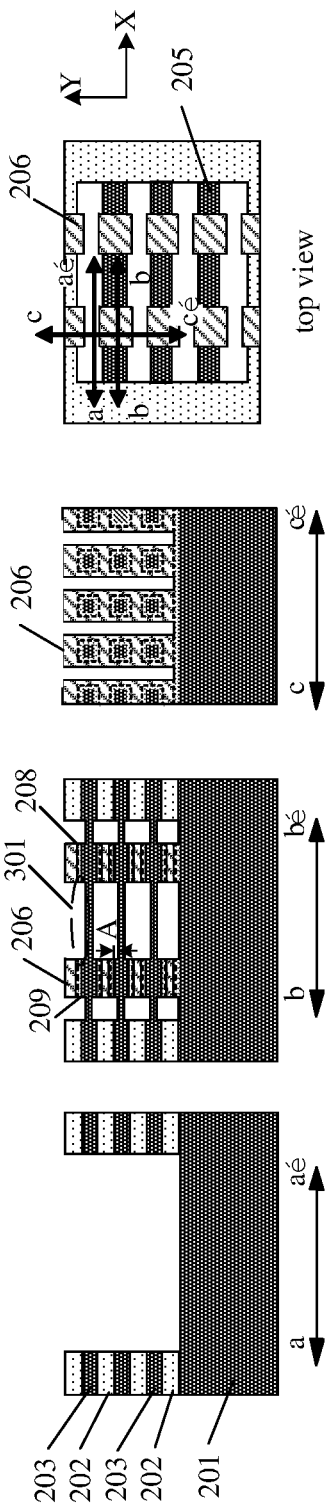
FIGS. 3A to 3B are schematic diagrams of local structures of a method for forming sources and drains provided by an embodiment of the disclosure.
Figure 3B:
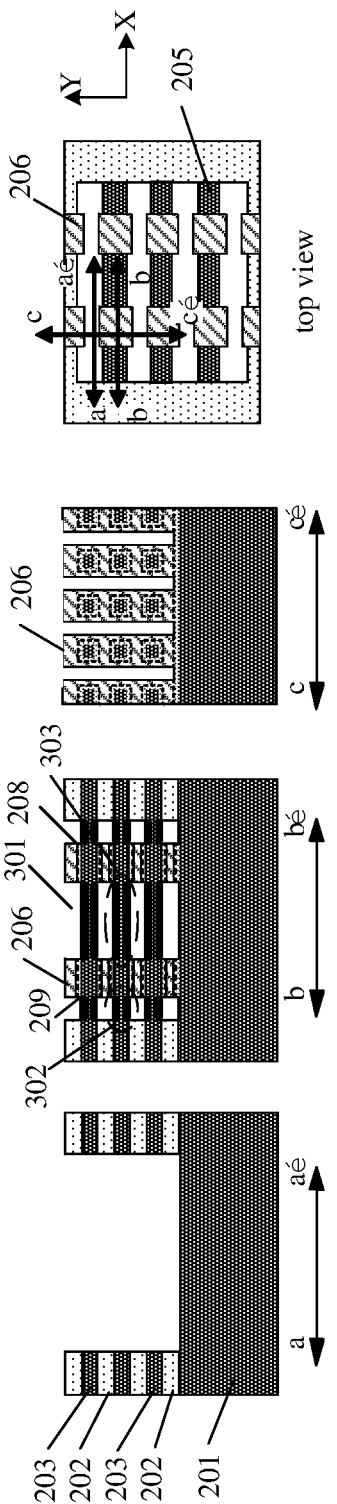

Based on the aforementioned embodiments, FIGS. 3A to 3B are schematic diagrams of local structures of a method for forming sources and drains provided by an embodiment of the disclosure. As shown in FIG. 3A, before forming the sources 210 and the drains 211, part of the semiconductor layer 203 except in the word line pillars 206 in the semiconductor pillar is removed to form the spaces 301, which are shown as a dashed line in the figure.

In some embodiments, the removal of part of the semiconductor layer 203 may be to remove a preset thickness A of the semiconductor layer 203 in the second direction from the upper surface and the lower surface of the semiconductor layer 203, respectively. In the embodiments of the present disclosure, part of the semiconductor layer 203 may be removed by wet etching or dry etching.

After the spaces 301 are formed, correspondingly, S103 can be realized by S20, in which the sources 302 and the drains 303 are respectively formed in the spaces 301 at either side of the semiconductor pillar except in the word line pillars 206 by an epitaxial growth process, as shown by dashed lines in FIG. 3B.

In the embodiments of the disclosure, a thickness of the source 302 and the drain 303 in the second direction is less than a sum of thicknesses of the semiconductor layer 203 and the gate oxide layer 208 in the second direction, thereby avoiding failure of the semiconductor device due to contact of the sources 210 and the drains 211 with the dielectric layer 209.

In some embodiments, when the bit lines are formed in the third groove, it can be realized by the following operations.

In S30, an isolation layer is formed in the third groove.

Figure 4A:
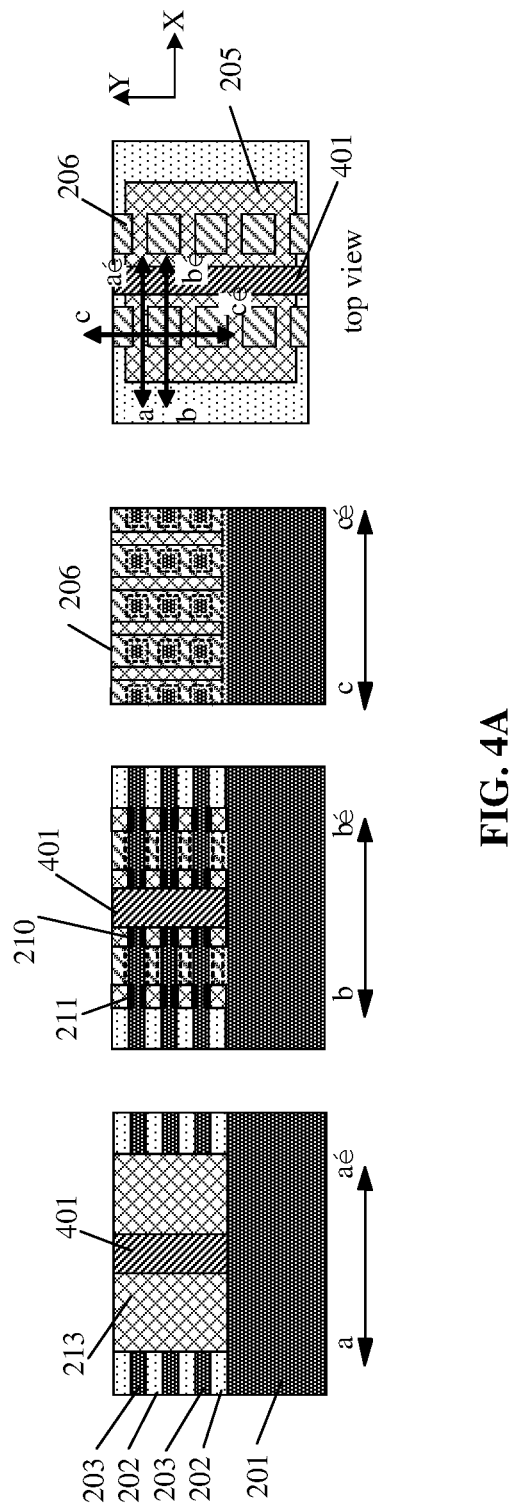
FIGS. 4A to 4C are schematic diagrams of local structures of bit lines provided by an embodiment of the disclosure.
Figure 4B:
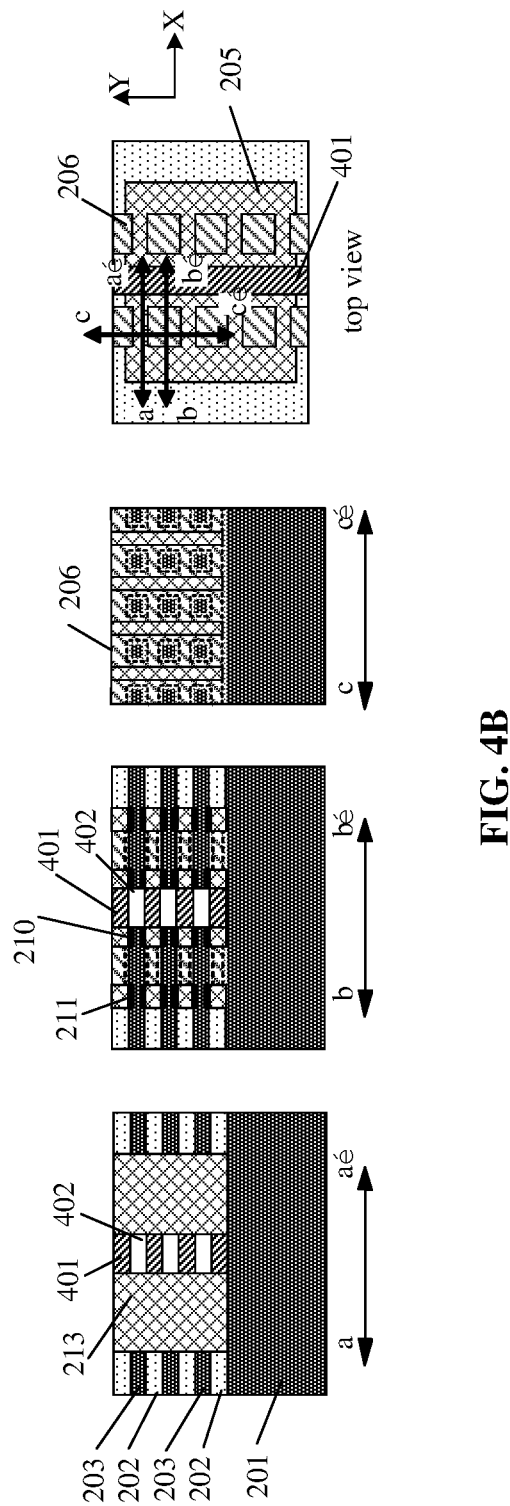
Figure 4C:
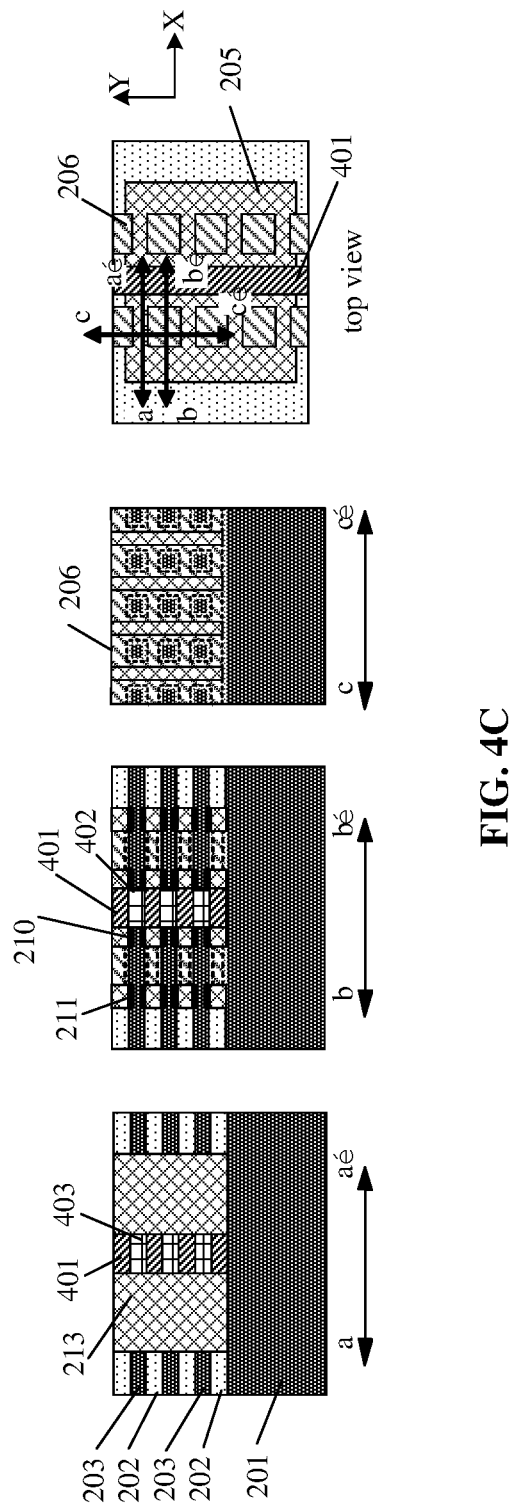

Based on the aforementioned embodiments, FIGS. 4A to 4C are schematic diagrams of local structures of bit lines provided by an embodiment of the disclosure. As shown in FIG. 4A, the isolation layer 401 may be formed in the third groove by physical vapor deposition, chemical vapor deposition, atomic layer deposition process or spin coating.

In S40, multiple bit line trenches arranged at intervals in the second direction and extending in the third direction are formed in the isolation layer.

As shown in FIG. 4B, the multiple bit line trenches 402 perpendicular to the substrate 201, arranged at intervals in the second direction and extending in the third direction may be formed in the isolation layer 401 by dry etching or wet etching.

In S50, the bit line are formed in the bit line trenches. A thickness of the bit line in the second direction is equal to a thickness of the source or the drain in the second direction.

As shown in FIG. 4C, the bit line trenches 402 may be filled by physical vapor deposition, chemical vapor deposition, atomic layer deposition or spin coating to form the bit lines 403.

In some embodiments, the formation of the bit lines may also be achieved by the following operations.

In S60, an isolation layer is formed in the third groove.

In S70, a bit line isolation layer is formed by back etching the isolation layer. The upper surface of the bit line isolation layer in the second direction is flush with the lower surface of the source or the drain in the second direction.

In S80, a bit line with a same thickness as the source or the drain are formed on the surface of the bit line isolation layer.

Figure 5A:
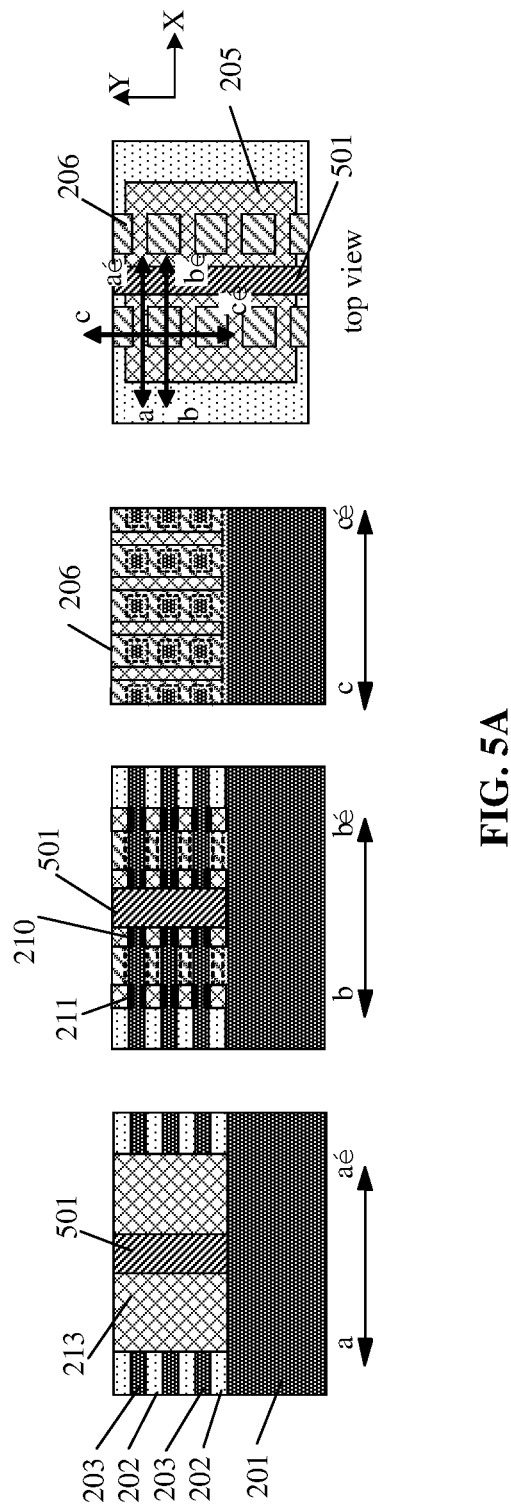
FIGS. 5A to 5D are schematic diagrams of local structures of bit lines provided by an embodiment of the disclosure.

Based on the aforementioned embodiments, FIGS. 5A to 5D are schematic diagrams of local structures of bit lines provided by an embodiment of the disclosure. As shown in FIG. 5A, the isolation layer 501 may be formed in the third groove by physical vapor deposition, chemical vapor deposition, atomic layer deposition process or spin coating.

Figure 5B:
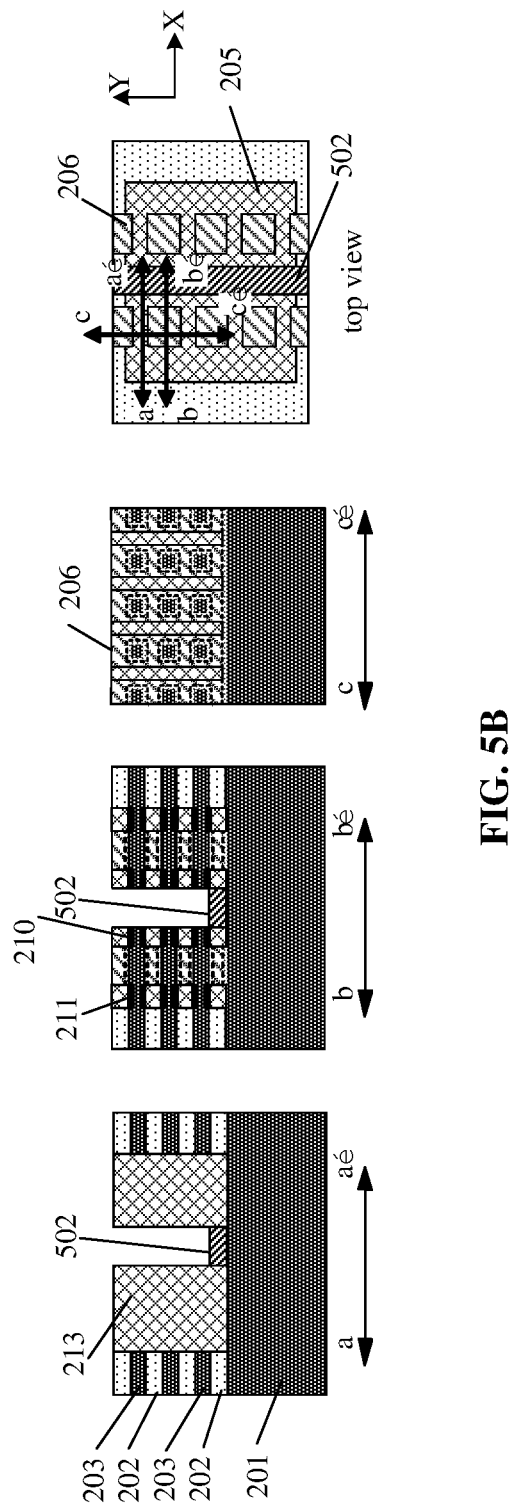

As shown in FIG. 5B, the isolation layer 501 may be etched back by dry etching or wet etching to form a bit line isolation layer 502 whose upper surface in the second direction is flush with a lower surface of the source or the drain in the second direction, so that the formed bit line is connected to the source or drain.

Figure 5C:
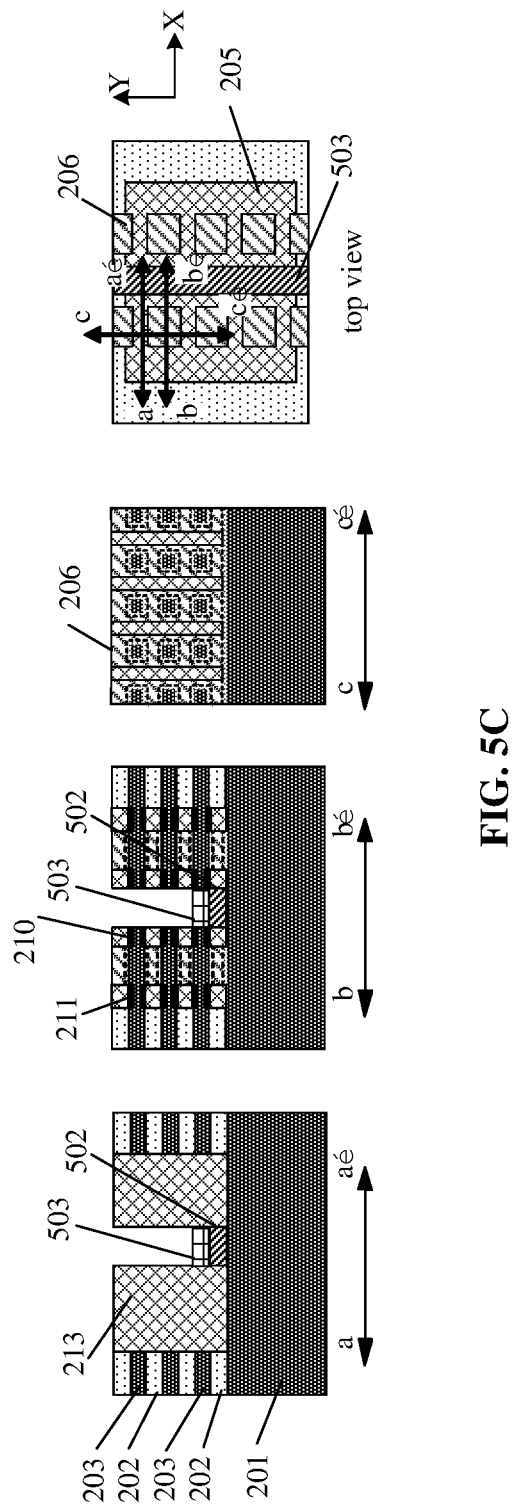
Figure 5D:
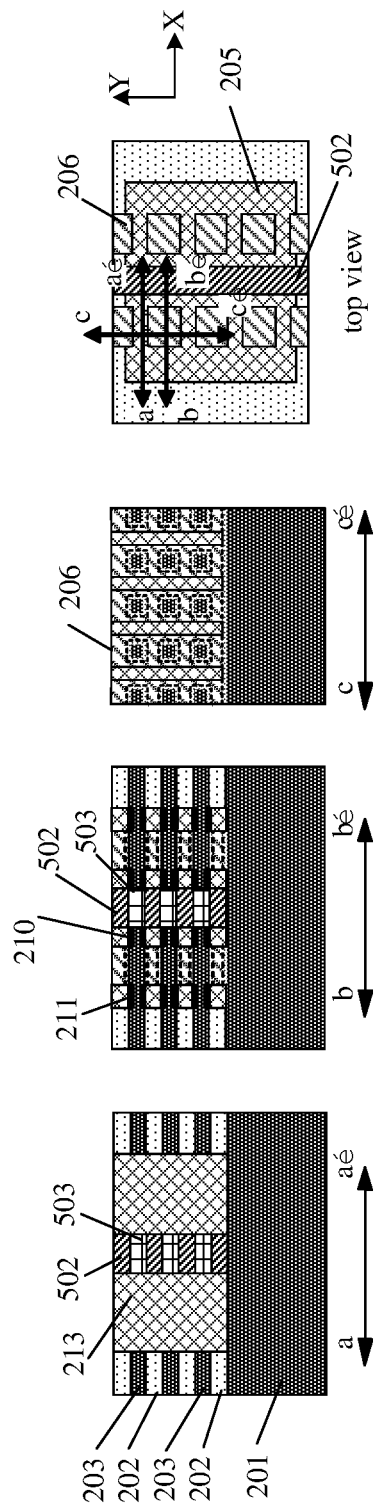

Next, referring to FIGS. 5C and 5D, the bit line 503 with a same thickness as the source or the drain is formed on the surface of the bit line isolation layer 502. Then, another isolation layer is deposited, the isolation layer is etched back again, and another bit line is formed on the surface of the isolation layer.

Figure 6:
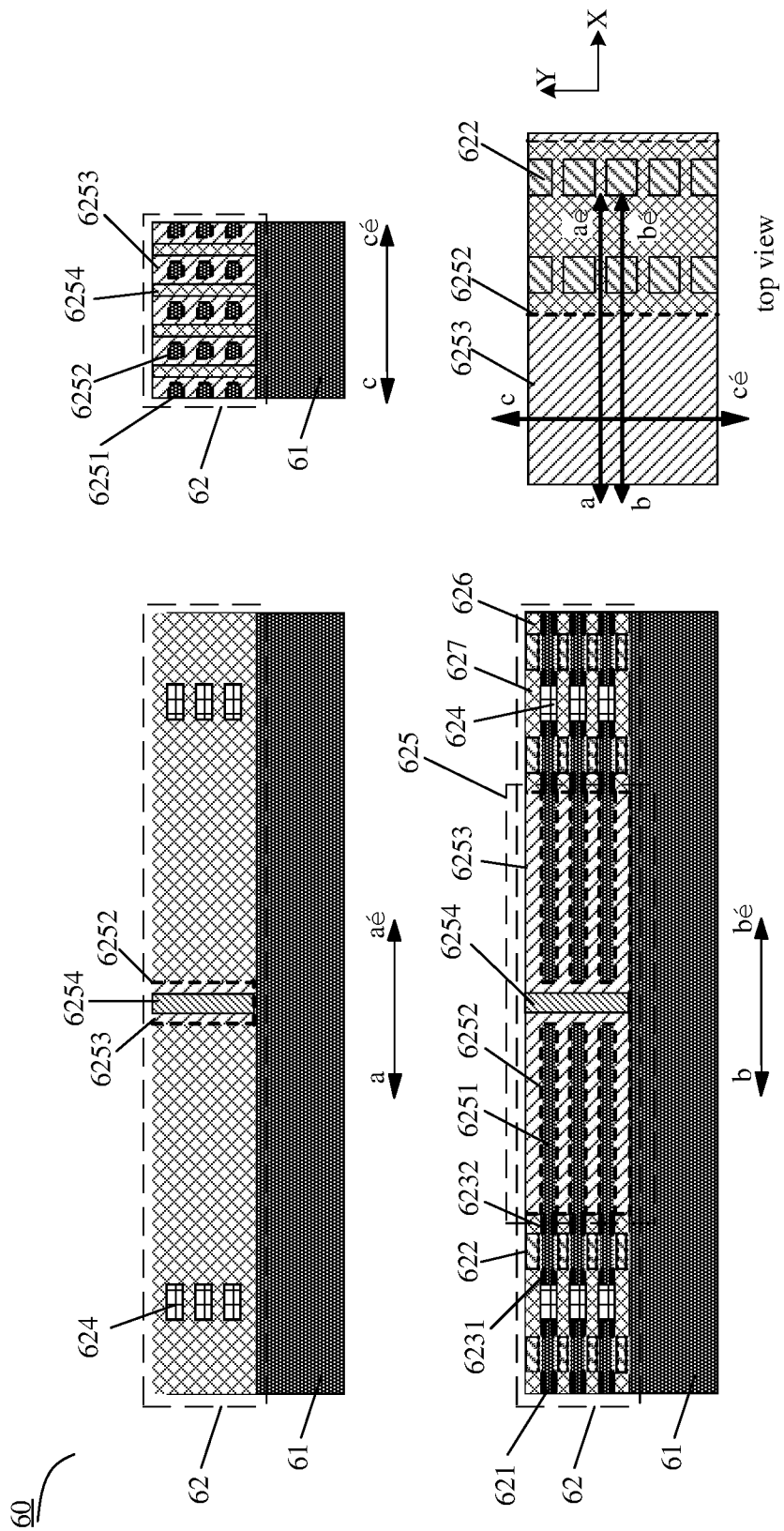
FIG. 6 is a schematic diagram of a local structure of a semiconductor device provided by an embodiment of the disclosure.

Based on the method for forming a semiconductor device above, the embodiments of the present disclosure further provide a semiconductor device, as shown in FIG. 6, which is a schematic structural diagram of the semiconductor device provided by an embodiment of the present disclosure. The semiconductor device 60 includes at least a substrate 61 and a semiconductor structure 62. The semiconductor structure 62 includes semiconductor pillars 621, word line pillars 622, active areas 623 (including sources 6231 and drains 6232), bit lines 624 and capacitors 625.

In the embodiments of the disclosure, the semiconductor device provided by the embodiments of the disclosure is described by an example where the sources 6231 are connected to the bit lines 624 and the capacitors 625 are connected to the drains 6232. FIG. 6 is a top view of the semiconductor device 60 and cross-sectional views of the semiconductor device 60 in the directions a-a', b-b' and c-c' in the top view. As shown in FIG. 6, the semiconductor structure 62 is positioned on a surface of the substrate 61. The semiconductor pillars 621 are positioned on the surface of the substrate and are stacked at intervals. The semiconductor pillars 621 extend in a first direction, and the semiconductor pillars 621 are arranged at intervals in the second direction. The word line pillars 622 extend in a second direction, intersect the semiconductor pillars 621 and surround the semiconductor pillars 621. The sources 6231 and the drains 6232 are located in the word line pillar 622 and are distributed on either side of the semiconductor pillars 621 surrounded by the word line pillars 622. The bit lines 624 are located on a side of the sources 6231 and the drains 6232, and are connected with the sources 6231 and drain 6232. The bit lines 624 extend in a third direction. The capacitors 625 are located on a side of the sources 6231 and the drains 6232 where the bit lines 624 are not formed.

In the embodiments of the disclosure, the X direction is the first direction, the Y direction is the third direction, and the Z direction is the second direction. The first direction, the second direction, and the third direction are pairwise perpendicular.

In some embodiments, the semiconductor structure 62 further includes word line isolation layers 626 and bit line isolation layers 627. The word line isolation layers 626 and the active areas 623 are arranged at intervals in the second direction in the semiconductor pillars 621. The bit line isolation layers 627 and the bit lines 624 are arranged at intervals in the second direction in the semiconductor structure 62.

In some embodiments, the capacitors 625 further include first electrode layers 6251, capacitive dielectric layers 6252, second electrode layers 6253 and a capacitive filler 6254. The first electrode layers 6251 extend in the first direction and are connected to the drains 6232 or the sources 6231. The capacitive dielectric layer 6252 and the second electrode layer 6253 sequentially cover the surface of the first electrode layer 6251. The capacitive filler 6254 fills a gap between the second electrode layers 6253.

In the embodiments provided by the disclosure, it is to be understood that the disclosed devices and methods may be implemented in a non-target manner. The device embodiments described above are only schematic. For example, the division of the unit is only a logical function division, and there may be another division mode in actual implementation, such as: multiple units or components can be combined, or integrated into another system, or some features can be ignored or not executed. In addition, the components shown or discussed are coupled or directly coupled with each other.

The units described above as separate parts may or may not be physically separated, and the parts shown as units may or may not be physical units, i.e. may be located in one place or may be distributed over multiple network units. According to the actual needs, some or all of the units can be selected to achieve the purpose of the solutions of the embodiments.

The features disclosed in several method or device embodiments provided by the disclosure can be arbitrarily combined without conflict, in order to obtain a new method or device embodiment.

The above-mentioned is only specific implementations of the disclosure, but the scope of protection of the disclosure is not limited thereto. Any change or substitution that can easily be think of by those skilled familiar with the technical field within the technical scope of the disclosure shall be covered within the scope of protection of the disclosure. Therefore, the scope of protection of this disclosure shall be subject to the scope of protection of the claims.

The invention claimed is:

1. A method for forming a semiconductor device, comprising:
   providing a stacked structure, which comprises a substrate, and sacrificial layers and semiconductor layers alternately stacked on a surface of the substrate, wherein multiple first grooves and semiconductor pillars extending in a first direction are comprised in the sacrificial layers and the semiconductor layers, and the first grooves and the semiconductor pillars are arranged at intervals;
   forming word line pillars in a second direction, wherein the word line pillars intersect with the semiconductor pillars and surround the semiconductor pillars, and the first direction is perpendicular to the second direction;
   forming sources and drains respectively on either side of the semiconductor pillars surrounded by the word line pillars by an epitaxial growth process;
   forming bit lines on a side of the sources or the drains, wherein the bit lines are connected with the sources or the drains, the bit lines extend in a third direction, the first direction, the second direction and the third direction are pairwise perpendicular; and
   forming capacitors on a side of the sources or the drains where the bit lines are not formed to form a semiconductor device.

2. The method according to claim 1, wherein the forming the word line pillars in a second direction, wherein the word line pillars intersect with the semiconductor pillars and surround the semiconductor pillars, comprises:
   removing the sacrificial layers in the semiconductor pillars to form second grooves;
   forming an initial gate oxide layer and an initial dielectric layer sequentially on surfaces of the first grooves and the second grooves; and
   forming the word line pillars in the second direction at preset positions of the semiconductor pillars, wherein the word line pillars intersect with and surround part of the initial dielectric layer.

3. The method according to claim 2, further comprising:
   after forming the word line pillars,
   removing the initial gate oxide layer and the initial dielectric layer except in the word line pillars on the surfaces of the first grooves and the second grooves to form gate oxide layers and dielectric layers in the word line pillars.

4. The method according to claim 3, wherein a thickness of the source or the drain in the second direction is less than a sum of thicknesses of the semiconductor layer and the gate oxide layer in the second direction.

5. The method according to claim 1, further comprising:
   before forming the sources or drains,
   removing part of a semiconductor layer except in the word line pillars in the semiconductor pillars to form spaces;
   wherein the forming the sources and the drains respectively on either side of the semiconductor pillars surrounded by the word line pillars by the epitaxial growth process comprises:
   forming the sources and the drains respectively in the spaces at either side of the semiconductor pillars except in the word line pillars by the epitaxial growth process.

6. The method according to claim 5, wherein the removing part of the semiconductor layer except in the word line pillars in the semiconductor pillars comprises:
   removing a preset thickness of the semiconductor layer in the second direction from an upper surface and a lower surface of the semiconductor layer, respectively.

7. The method according to claim 2, further comprising:
   after forming the sources or the drains,
   forming word line isolation layers in remaining first grooves and remaining second grooves.

8. The method according to claim 1, wherein the forming the bit lines on the side of the sources or the drains comprises:
   forming a third groove extending in the third direction, wherein the third groove is located at the side of the sources or the drains, and exposes the substrate; and
   forming the bit lines in the third groove.

9. The method according to claim 8, wherein the forming the bit lines in the third groove comprises:
   forming an isolation layer in the third groove;
   forming multiple bit line trenches arranged at intervals in the second direction and extending in the third direction in the isolation layer; and
   forming the bit lines in the bit line trenches, wherein a thickness of the bit line in the second direction is equal to a thickness of the source or the drain in the second direction.

10. The method according to claim 8, wherein the forming the bit lines in the third groove comprises:
    forming an isolation layer in the third groove;
    etching back the isolation layer to form a bit line isolation layer, wherein an upper surface of the bit line isolation layer in the second direction is flush with a lower surface of the source or the drain in the second direction; and
    forming the bit line with a same thickness as the source or the drain on a surface of the bit line isolation layer.

11. The method according to claim 1, wherein the forming the capacitors on the side of the sources or the drains where the bit lines are not formed comprises:
    removing sacrificial layers and part of a semiconductor layer in the stacked structure on the side of the sources or the drains where the bit lines are not formed to form first electrode layers extending in the first direction and connected to the drains;
    forming sequentially a capacitive dielectric layer and a second electrode layer that cover the first electrode layer; and
    filling a gap between the second electrode layers to form the capacitors.

* * * * *